United States Patent
Mukherjee

(10) Patent No.: US 6,690,385 B1
(45) Date of Patent: Feb. 10, 2004

(54) ROBUST BOOLEAN OPERATIONS IN DESIGN RULE CHECKING

(75) Inventor: Maharaj Mukherjee, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 272 days.

(21) Appl. No.: 09/696,578

(22) Filed: Oct. 25, 2000

(51) Int. Cl.⁷ .............................................. G06T 11/00
(52) U.S. Cl. ..................................... 345/622; 345/624
(58) Field of Search ................................ 345/621, 624; 716/10, 11, 20

(56) References Cited

U.S. PATENT DOCUMENTS 6,466,229 B1 * 10/2002 Nagao ......................... 345/621

OTHER PUBLICATIONS

Mark Friedell & Sandeep Kochhar, "Toward Reliable Polygon Set Operations" (Graphics Interface '90) 1990 pp. 167–174.

Paul Wallich, "Garbage In, Garbage Out", (Scientific American), Dec. 1990, p. 126.

Don P. Mitchell, "Robust Ray Intersection with Interval Arithmetic", (Graphics Interface '90) 1990, p. 68–72.

H. Bronnimann & M. Yvinec, "Efficient Exact Evaluation of Signs of Determinants", 1997.

H. Bronnimann, I. Z. Emiris, V. Y. Pan, S. Pion, "Computing Exact Geometric Predicates Using Modular Arithmetic With Single Precision", 1997.

H. Bronnimann & S. Pion, "Exact Rounding for Geometric Constructions", pp. 1–4, 1997.

Chun–Yi–Hu, Takashi Maekawa, Evan C. Sherbrooke & Nicholas M. Patrikalakis, "Robust Interval Algorithm For Cure Intersections", 1996, pp. 495–506.

Christoph M. Hoffman, "The Problems of Accuracy and Robustness in Geometric Computation", Mar. 1989, pp. 31–41.

Victor Milenkovic, "Double Precision Geometry: A General Technique for Calculating Line and Segment Intersections Using Rounded Arithmetic", 1989, pp. 500–505.

Victor J. Milenkovic, "Verifiable Implementations of Geometric Algorithms Using Finite Precision Arithmetic", Dec. 1987, pp. 378–401.

V. J. Milenkovic, "Shortest Path Geometric Rounding", 1998, pp. 58–86.

Daniel H. Greene & F. Frances Yao, "Finite–Resolution Computational Geometry", 1986, pp. 143–152.

S. P. Mudur & P. A. Koparkar, "Interval Methods for Processing Geometric Objects", 1984, pp. 7–17.

Mark Segal & Carlo H. Sequin, "Consistent Calculations For Solids Modeling", 1984, pp. 29–38.

Steven Fortune & Victor Milenkovic, "Numerical Stability of Algorithms For Line Arrangements", 1991.

Christoph M. Hoffman, John E. Hopcroft, Michael S. Karasick, "Robust Set Operations on Polyhedral Solids", Nov. 1989, pp. 50–59.

(List continued on next page.)

Primary Examiner—Jeffery Brier
Assistant Examiner—Motilewa Good-Johnson
(74) Attorney, Agent, or Firm—H. Daniel Schnurmann; RatnerPrestia

(57) ABSTRACT

A process for preventing spurious intersections in a polygon due to rounding by using proximity-based rounding. A vertex of a polygon is identified which is located within a unit integer box through which an edge of the polygon passes that does not have the vertex as an endpoint. The identified vertex is embedded on the edge which passes through the same unit integer box. Then the vertices are rounded to integer coordinates. In one embodiment of the invention, the proximity-based rounding is performed on an output polygon from a Boolean operation in a design rule checking algorithm.

15 Claims, 8 Drawing Sheets

OTHER PUBLICATIONS

Steven Fortune, "Stable Maintenance of Point Set Triangulations In Two Dimensions", 1989, pp. 494–499.

David Dobkin & Deborah Silver, "Recipes For Geometry & Numerical Analysis—Part I: Empirical Study", pp. 93–105.

Leonidas Guibas, David Salesin, Jorge Stolfi, "Epsilon Geometry: Building Robust Algorithms From Imprecise Computations", Jun. 5–7, 1989, pp. 208–217.

Thomas Ottmann, Gerald Thiemt & Christian Ullrich, "Numerical Stability of Simple Geometric Algorithms In The Plane", 1987, pp. 277–293.

Steven Fortune & Christopher J. Van Wyk, "Efficient Exact Arithmetic For Computational Geometry", Feb. 18, 1993, pp. 163–171.

Christoph M. Hoffmann "Geometric and Solid Modeling", 1989, pp. 111–153.

* cited by examiner

ROBUST BOOLEAN OPERATIONS IN DESIGN RULE CHECKING

FIELD OF THE INVENTION

The present invention relates generally to fabrication of integrated circuits and more particularly to a process for reducing failures due to round-off errors during design rule checking algorithms.

BACKGROUND OF INVENTION

Integrated circuits must be layed out so that components (i.e., resistors, transistors, diodes, capacitors, and the like) and wiring between the components do not intersect at undesired locations but do have sufficient spacing between them to operate reliably. To meet these requirements, integrated circuit layout is performed using a computer program applying a design rule checking (DRC) algorithm. DRC can require checking millions or even tens of millions of geometric shapes to verify that they satisfy the closeness requirements (i.e., design rules) for reliable operation of the integrated circuit being designed.

DRC algorithms typically perform Boolean operations such as intersection, union, and difference using polygons to represent the components and wiring on the integrated circuit. In many DRC implementations, the polygons are represented using long or integer coordinates. When Boolean operations such as intersection, union, and difference are performed using these polygons, vertex coordinates are computed by intersecting two edges using floating point computations. Then, these vertex coordinates are rounded to long or integers for the output polygon. As a result of this rounding, the output polygons can intersect spuriously. For example, an output polygon can self-intersect to create a bow-tie, or an inside loop can intersect an outside loop that is supposed to enclose the inside loop. These spurious intersections, create undefined or ill defined point-sets, resulting in ambiguous or wrong answers for DRC operations.

Many DRC algorithms operate on the assumption that the output of the Boolean operations that form the foundation of these algorithms are regular and well-defined point sets, and that these point-sets are defined by well-defined polygonal boundaries. Round-off errors during Boolean computations can cause algorithm failures without warning. These undetected errors can cause severe consequences, including wasted computation time due to ambiguous or wrong results or even defective dies due to undetected errors.

The importance of overcoming the various deficiencies noted above is evidenced by the extensive technological development directed to the subject, as documented by the relevant patent and technical literature. Several approaches disclosed in the technical literature focus on minimizing round-off errors in geometric computations. One approach uses a statistical approach to minimize errors, as described in "Recipes for Geometry & Numerical Analysis—Part I: An Empirical Study," by Dobkin et al., Proceedings of the ACM Symposium on Computational Geometry, page 93 (1988). Another approach provides a method for minimizing the effect of round-off error by using least significant bit calculations, as described in "Numerical Stability of Simple Geometric Algorithms in the Plane," by Ottmann et al., Proceedings of the ACM Symposium on Computational Geometry, page 163 (1993). Yet another approach uses minimum feature size for Boolean intersections, as described in "Consistent Calculations for Solids Modeling," by Segal et al., Proceedings of the ACM Symposium on Computational Geometry, page 29 (1985). These approaches minimize, but do not eliminate, rounding errors. Because rounding errors are not eliminated, they can still cause problems for DRC algorithms.

Other approaches attempt to eliminate spurious intersections caused by round-off error, but are very expensive and difficult to implement due to memory requirements, inefficient computational methods, and quantity of computations. "Epsilon Geometry: Building Robust Algorithms for Imprecise Computations," Guibas et al., Proceedings of the ACM Symposium on Computational Geometry, page 208 (1989), teaches a method using a fuzzy tool for topological consistency checking. "Geometric and Solid Modeling," by C. Hoffmann, pages 111–53 (Morgan Kaufmann Publishers, Inc. 1989), attempts a topological reasoning method for maintaining topological consistency by using nonredundancy. "Efficient Exact Arithmetic for Computational Geometry," Fortune et al., ACM Symposium on Conceptual Geometry, page 163 (1993), advocates computations in the exact precision domain. "Interval Methods for Processing Geometric Objects," Mudur et al., IEEE Computer Graphics and Applications, 4(2):7 (1984), teaches an interval arithmetic approach for computing curve intersections using two bounds for each integer. "Finite-Resolution Computational Geometry," Greene et al., Proceedings of Twenty-Seventh Annual IEEE-FOCS Conference, page 143 (1986), uses an algorithm for line intersection using number theoretic algorithms. Each of these approaches requires at least one of excess data storage, inefficient algebraic systems, and excess computations—making the approaches prohibitively expensive to implement in a DRC algorithm.

Yet another approach is disclosed in "Verifiable Implementations of Geometric Algorithms Using Finite Precision Arithmetic," V. Milenkovic, in *Geometrical Reasoning*, pages 377–401 (D. Kapur & J. Mundy eds., MIT Press, 1989). Milenkovic teaches a method for eliminating spurious intersections of two separate polygons by cracking edges at any vertex ($v_i$) whose coordinate location is within an error value ($\epsilon$) of any edge ($e_1$, $e_2$, $e_3$, and so on). The error value ($\epsilon$) is defined as the maximum possible error, which is a function of the maximum round-off and the number of arithmetic operations (for DRC algorithms, the number of arithmetic operations can be in the millions or even tens of millions). Each edge which is within $\epsilon$ of a vertex of the other polygon is then converted to multiple new edges having endpoints at each of the vertices that were within $\epsilon$ of that edge. Because this edge cracking can create new edge-vertex pairs within the error value ($\epsilon$), the process is repeated until no further edge cracking is possible.

Although this method eliminates certain spurious intersections, it may cause many more edge cracks than are necessary (i.e., the proximity of the edge-vertex pair would not cause spurious intersections, because the vertex would not be rounded off to the opposite side of the edge or the particular edge-vertex proximity would be eliminated by a Boolean operation). Unnecessary edge cracks would cause a DRC program to expend excess memory and computation time. In addition, unnecessary edge cracking can cause unwarranted distortion of the geometric shapes used in a DRC application.

Therefore, an object of the present invention is to provide a process for preventing failures due to round-off during design rule checking algorithms. It is a further object of the present invention to provide a process for preventing failures due to round-off during design rule checking algorithms which requires minimum memory and computational time.

SUMMARY OF THE INVENTION

To achieve these and other objects, and in view of its purposes, the present invention provides a process for proximity-based rounding. A vertex which is close to an edge for which it is not an endpoint is embedded on that edge. The edge is then converted to two edges, each having one of the original endpoints and both having the embedded vertex as the other endpoint.

In one embodiment of the present invention, a design rule checking algorithm uses proximity-based rounding after a Boolean operation is performed on input polygons to produce an output polygon. Each vertex of the output polygon is checked for proximity to each edge of the output polygon by determining whether the vertex is located within an integer box through which the edge passes. If so, the vertex is embedded on the edge. Following proximity-based rounding, the coordinates (vertices) of the output polygon are rounded to integers. Because the vertex and the point embedded on the edge in proximity to the vertex are now the same point, they are rounded to the same integer and the edges associated with the vertex do not spuriously intersect with the edge in proximity to the vertex.

The present invention achieves these benefits in the context of known process technology. A further understanding of the nature and advantages of the present invention may be realized by reference, however, to the latter portions of the specification and attached figures. It is to be understood that both the foregoing general description and the following detailed description are exemplary, but are not restrictive, of the invention.

BRIEF DESCRIPTION OF THE DRAWING

The features and advantages of a semiconductor device according to the present invention and further details of a process of fabricating such a semiconductor device in accordance with the present invention will be more clearly understood from the following description taken in conjunction with the accompanying figures in which like reference numbers designate similar or corresponding elements, regions, and portions and in which.

DETAILED DESCRIPTION OF THE INVENTION

The present invention will be described in detail with reference to the accompanying figures. The present invention provides a process for performing Boolean operations in design rule checking using proximity-based rounding. Proximity-based rounding prevents spurious intersections without requiring unnecessary memory or computational demands.

A. Source of Problem

Figure 1:
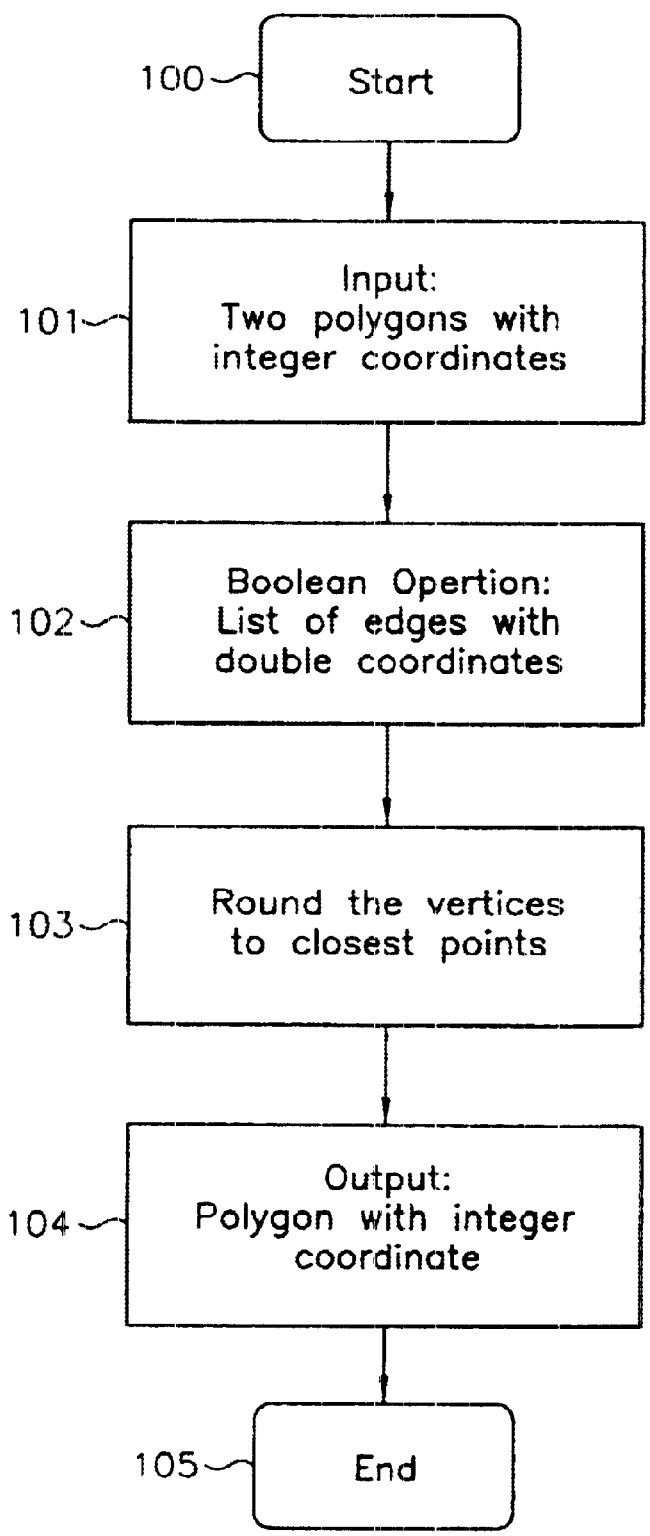
FIG. 1 is a flow diagram for a DRC algorithm for a Boolean operation having a problem.

FIG. 1 is a flow diagram for a DRC algorithm for a Boolean operation which the inventor has determined to have a problem. Following start of the algorithm (step 100), two polygons defined by vertices with integer coordinates are input into the algorithm (step 101). A Boolean operation, such as intersection, union, or difference is performed (step 102), producing an output polygon defined by a list of edges with double coordinates. The vertices of the output polygon are rounded to the closest integer points (step 103). Then the rounded output polygon with integer coordinates is output (step 104) before ending the algorithm (step 105). The problem with this algorithm is that a vertex of the output polygon can be on one side of a nearby edge of the polygon before rounding, but shift to the opposite side of the edge after rounding.

Figure 2A:
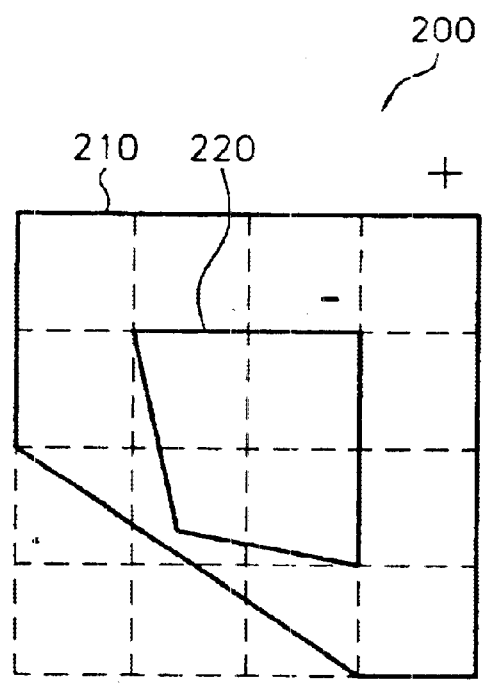
FIG. 2A shows a first output polygon before rounding which would cause round-off error using the DRC algorithm of FIG. 1.
Figure 2B:
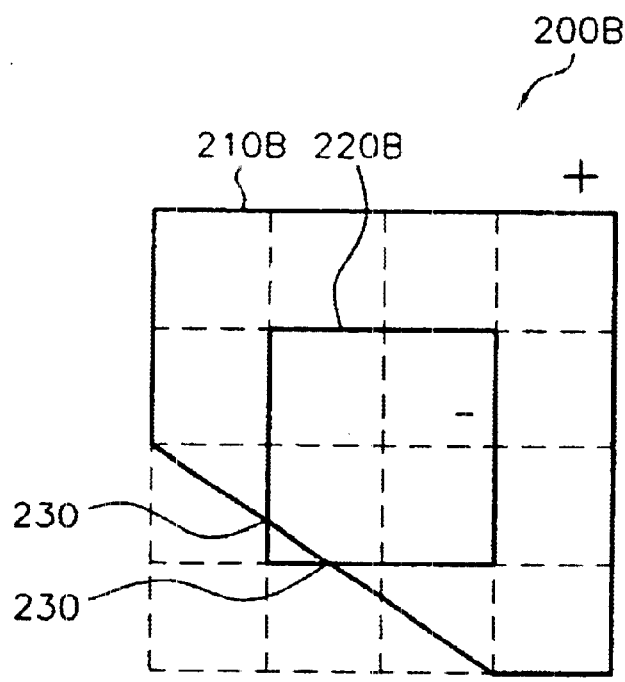
FIG. 2B shows the output polygon of FIG. 2A after normal rounding.

For example, a first output polygon (200) can have an outside loop (210) and an inside loop (220) as shown in FIG. 2A. The outside loop (210) is defined by vertices (0.0, 2.0), (3.0, 0.0), (4.0, 0.0), (4.0, 4.0), and (0.0, 4.0). The inside loop (220) is defined by vertices (1.0, 3.0), (3.0, 3.0), (3.0, 1.0), and (1.3, 1.3). After rounding, the resulting polygon (200B) will have spurious intersections (230) as shown in FIG. 2B. The spurious intersections (230) exist because, after rounding, the vertex (1.3, 1.3) on the inside loop (220B) is rounded to the integer coordinate (1, 1), which is outside of the outside loop (210B). Thus, the inside loop (220B) intersects and comes out of the outside loop (210B)—creating spurious intersections. These spurious intersections are an example of a topological inconsistency which can cause a DRC failure.

Figure 3A:
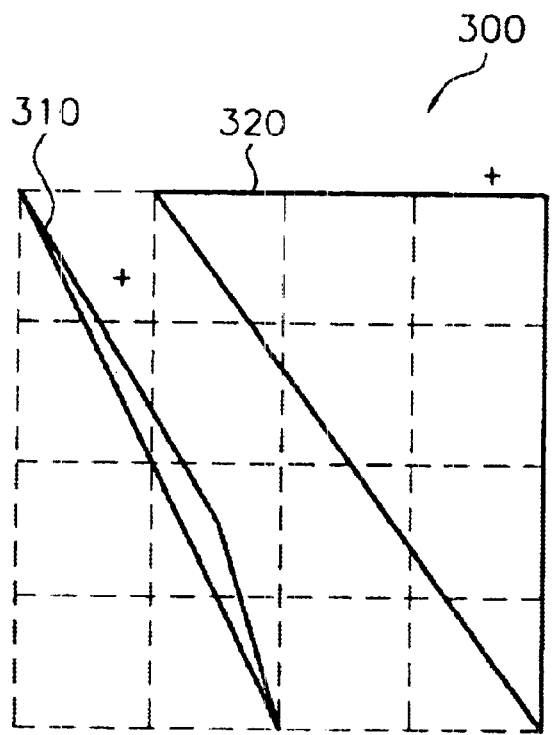
FIG. 3A shows a second output polygon before rounding which would cause round-off error using the DRC algorithm of FIG. 1.
Figure 3B:
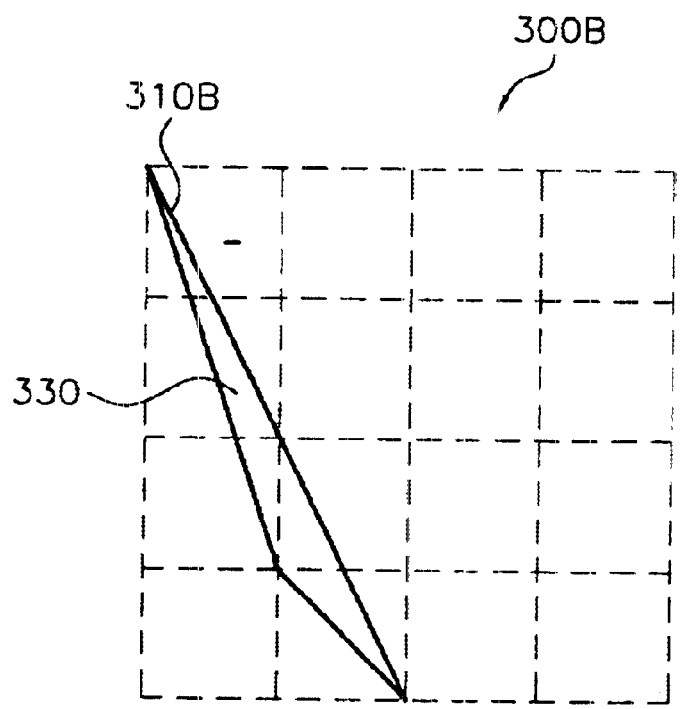
FIG. 3B shows the output polygon of FIG. 3A after normal rounding.

As shown in FIG. 3A, a second output polygon (300) can have two outside loops (310, 320). The first outside loop (310) of the second output polygon (300) is defined by the vertices (0.0, 4.0), (2.0, 0.0), and (1.4, 1.4). The second outside loop (320) of the second output polygon (300) is defined by the vertices (1.0, 4.0), (4.0, 0.0), and (4.0, 4.0). After rounding, the first loop (310B) of the second output polygon (300B) has a negative loop (330) as shown in FIG. 3B. The negative loop (330) exists because, after rounding, the first outside loop (310B) becomes an inside loop due to the change in orientation. When the first outside loop (310B) becomes an inside loop, the second outside loop (not shown) becomes irrelevant because it is now within the space covered by the inside (or negative) loop. This negative loop is an example of a topological inversion.

Figure 4A:
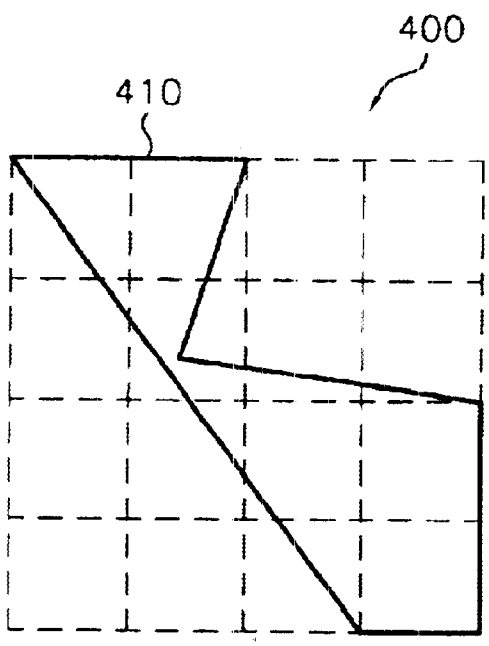
FIG. 4A shows a first output polygon before rounding which would cause round-off error using the DRC algorithm of FIG. 1.
Figure 4B:
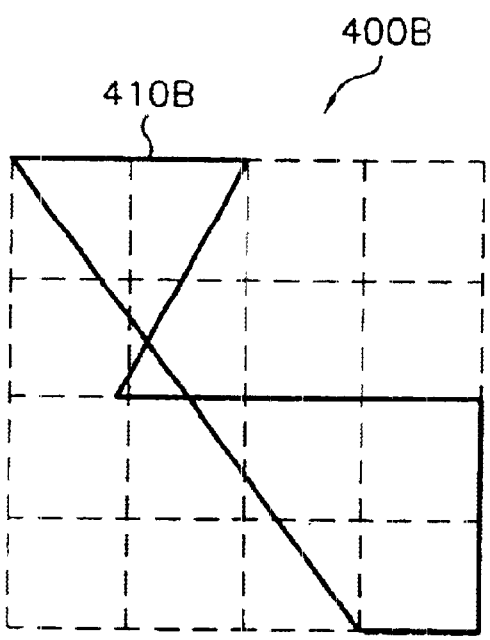
FIG. 4B shows the output polygon of FIG. 4A after normal rounding.

As shown in FIG. 4A, a third output polygon (400) can have a single loop (410). The single loop (410) is defined by the vertices (0.0, 4.0), (3.0, 0.0), (4.0, 0.0), (4.0, 2.0), (1.3, 2.3), and (2.0,4.0). After rounding, the loop (410B) of the third output polygon (400B) self-intersects, because vertex (1.3, 2.3) rounds to integer coordinate (1, 2) which crosses the edge defined by the vertices (0, 4) and (3, 0). This self-intersection is an example of a "bow tie" which provides an ambiguous definition of the point set that it is supposed to define.

B. Preferred Embodiment

Figure 5:
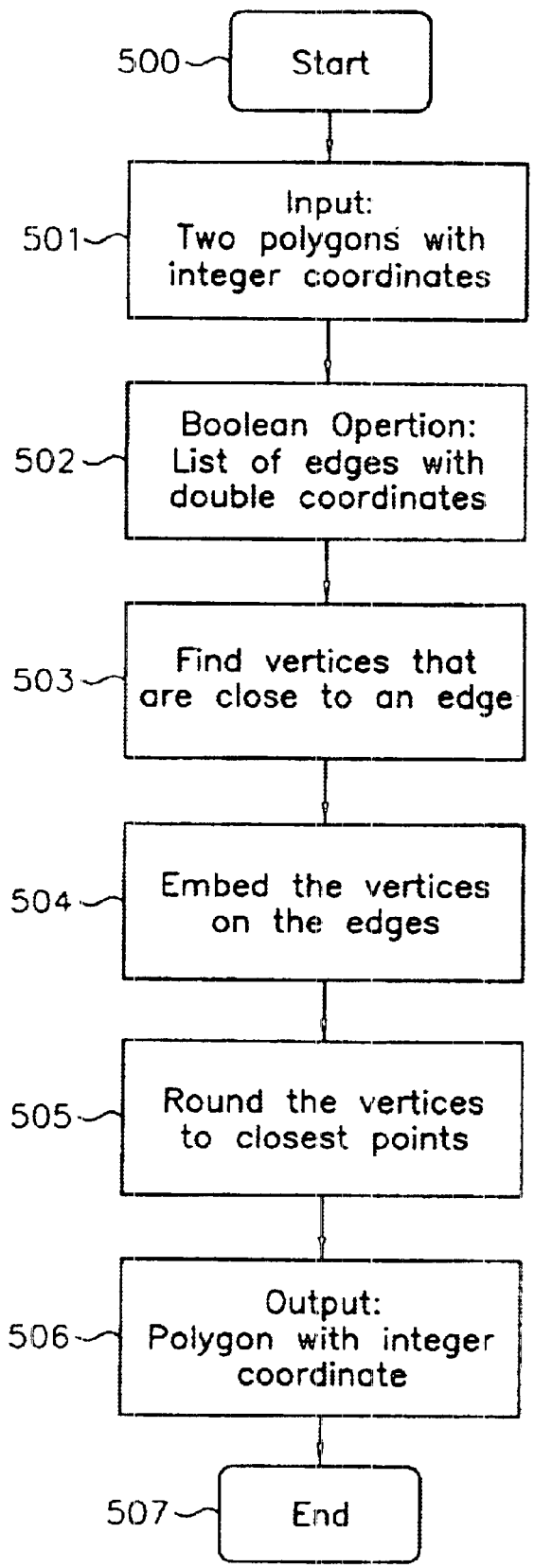
FIG. 5 is a flow diagram for a DRC algorithm for a Boolean operation using proximity-based rounding according to the present invention.

The flow diagram of a preferred embodiment of the present invention is shown in FIG. 5. As in the problem process illustrated in FIG. 1, following start of the algorithm (step 500), two polygons with integer coordinates are provided as input to the algorithm (step 501). Next, a Boolean operation is performed (step 502) providing an output polygon defined by a list of edges with double coordinates (i.e., vertices ($x_1$, $y_1$) and ($x_2$, $y_2$)). Before rounding the vertices (step 505), however, two new steps are added to the process in the preferred embodiment of the present invention.

First, the vertices which are close to an edge of the output polygon (other than the edge defined by the vertex) are identified (step 503). What is meant by "close to an edge" is that when a vertex $v_j$ is rounded to an integer coordinate, there is a chance that the edges associated with $v_j$ might spuriously intersect an edge $e_i$. This intersection can only happen if $e_i$ passes through the same integer box where $v_j$ is located. An integer box is a square of unit width and height centered at an integer coordinate. For the closeness check, the integer box of interest is the one where $v_j$ is located. This integer box is centered at integer coordinate q, defined by (round $x_j$, round $y_j$). Therefore, to check whether an edge $e_i$ having the equation $$Ax+By+C=0 \quad \text{(Eq. 1)}$$

passes through the unit box centered at q, the equation $$|C+A*\text{round}(x_j)+B*\text{round}(y_j)|/(|A|+|B|)<0.5 \quad \text{(Eq. 2)}$$

is applied.

Any vertex ($v_j$) which satisfies Eq. 2 for an edge ($e_i$) is embedded on that edge (step 504). Thus, if vertex ($v_j$: at coordinate $x_j$, $y_j$) satisfies the closeness check of Eq. 2 for an edge ($e_i$) defined by coordinates ($x_1$, $y_1$) and ($x_2$, $y_2$), then edge ($e_i$) is redefined as two edges defined by coordinates ($x_1$, $y_1$) and ($x_j$, $y_j$) and by coordinates ($x_j$, $y_j$) and ($x_2$, $y_2$), respectively. As will be understood by those skilled in the art, when the coordinates of the output polygon (with proximity-based rounded edges) are rounded to integer coordinates (step 505), the vertex (vj) and the new endpoint ($x_j$, yj) inserted onto the edge ($e_i$) will now round to the same integer, preventing spurious intersections.

The output polygon (with proximity-based rounded edges) is then provided as the output of the algorithm (step 506) before ending the algorithm (step 507). The proximity-based rounding of the present invention has been experimentally applied to Trapezoidal Decomposition based Boolean operations within a NIAGARA DRC code. NIAGARA is a DRC code available from International Business Machines, Inc. of Armonk, N.Y. The trapezoidal decomposition process is used for polygons that can have edges with any slope. The problem with rounding errors is particularly pronounced for this type of line. Proximity-based rounding has eliminated many long-standing bugs within the NIAGARA code, and no new bugs have been experienced in the NIAGARA code since implementing proximity-based rounding.

Figure 2C:
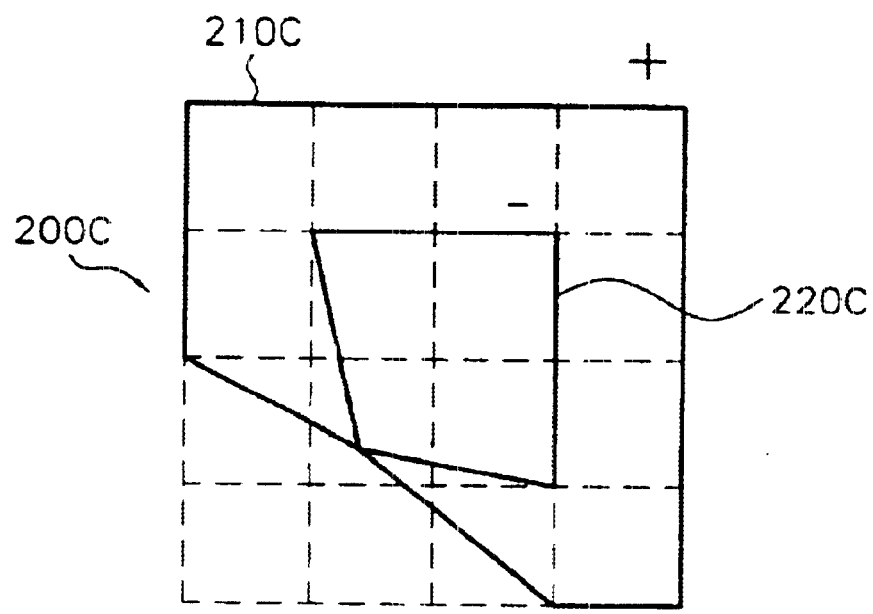
FIG. 2C shows the output polygon of FIG. 2A after edge cracking according to the present invention.
Figure 2D:
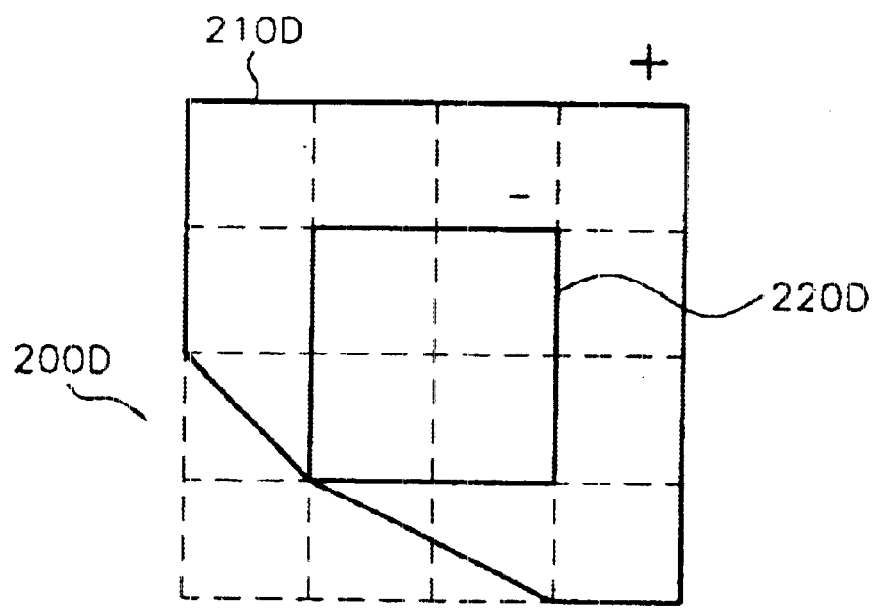
FIG. 2D shows the output polygon of FIG. 2C after rounding.

Referring again to FIG. 2A, the vertex (1.3, 1.3) on the inside loop (220) of the first output polygon (200) is located in the integer box centered at (1, 1). The edge (defined by coordinates (0.0, 2.0) and (3.0, 0.0)) on the outer loop (210) passes through the same integer box. Consequently, as shown in FIG. 2C, the vertex (1.3, 1.3) of the inside loop (220C) of the resulting polygon (200C) is embedded on the edge (0.0, 2.0) (3.0, 0.0) on the outside loop (210C) by proximity-based rounding, resulting in the edge (0.0, 2.0) (3.0, 0.0) being replaced by two new edges (0.0, 2.0) (1.3, 1.3) and (1.3, 1.3) (3.0, 0.0). Then, as shown in FIG. 2D, the vertex (1.3, 1.3) and the end points at (1.3, 1.3) embedded on the edge (0.0, 2.0) (3.0, 0.0) are rounded to integer coordinate (1, 1). The edges associated with the vertex on the inside loop (220D) which was originally located at (1.3, 1.3) and rounded to (1, 1) does not intersect the new edge on the outside loop (210D) of the resulting polygon (200D) defined by coordinates (0, 2) (1, 1) (3, 0).

Figure 3C:
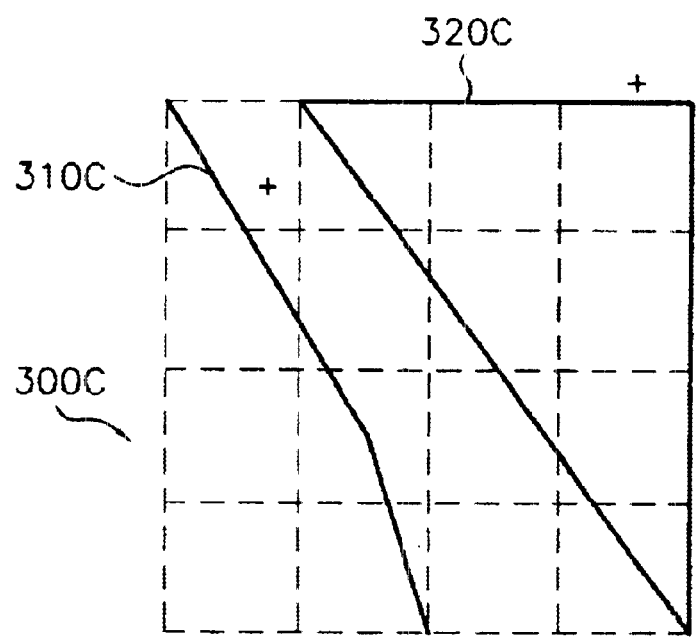
FIG. 3C shows the output polygon of FIG. 3A after edge cracking according to the present invention.
Figure 3D:
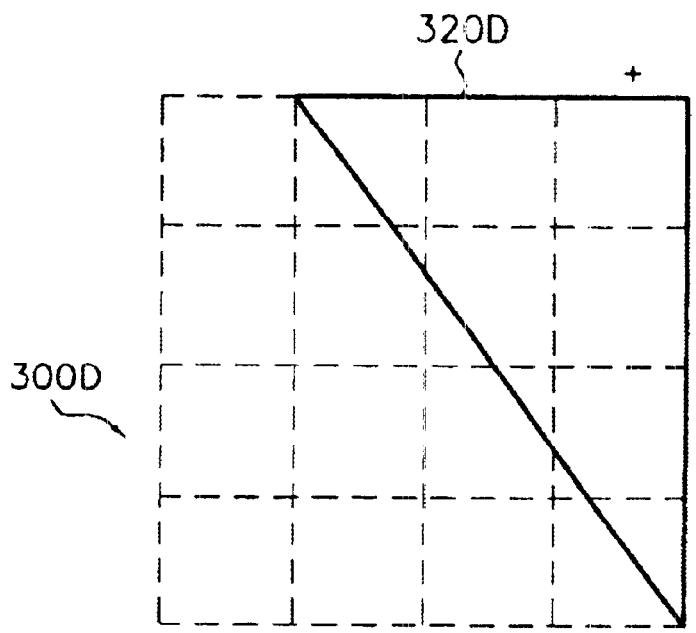
FIG. 3D shows the output polygon of FIG. 3C after rounding.

Referring again to FIG. 3A, the vertex (1.4, 1.4) of the first outside loop (310) of the second output polygon (300) is located in the integer box centered at (1, 1). The edge on the first outside loop (310) defined by endpoints (0.0, 4.0) (2.0, 0.0) passes through the same integer box. Consequently, as shown in FIG. 3C, the vertex (1.4, 1.4) on the first outside loop (310C) of the second output polygon (300C) is embedded on the edge (0.0, 4.0) (2.0, 0.0) on the first outside loop (310C) by proximity-based rounding. As a result of the proximity-based rounding, the edge (0.0, 4.0) (2.0, 0.0) is replaced by two new edges (0.0, 4.0) (1.4, 1.4) and (1.4, 1.4) (2.0, 0.0). Then, the vertex (1.4, 1.4) and the new end points at (1.4, 1.4) embedded on edge (0.0, 4.0) (2.0, 0.0) are rounded to integer coordinate (1, 1). The first outside loop (310C) becomes a loop of zero area defined by vertices (0, 4) (1, 1) (2, 0) (1, 1). The second outside loop (320C) is also shown in FIG. 3C. As shown in FIG. 3D, the first outside loop (not shown) with zero area drops out and the second output polygon (300D) becomes just the second outside loop (320D), which is now relevant because the negative loop has been removed.

Figure 4C:
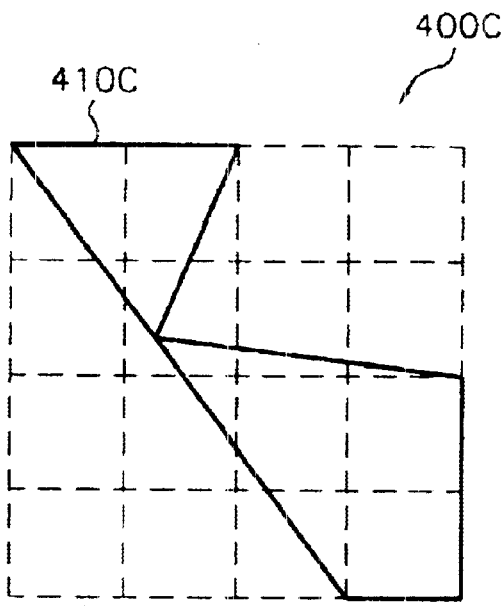
FIG. 4C shows the output polygon of FIG. 4A after edge cracking according to the present invention.
Figure 4D:
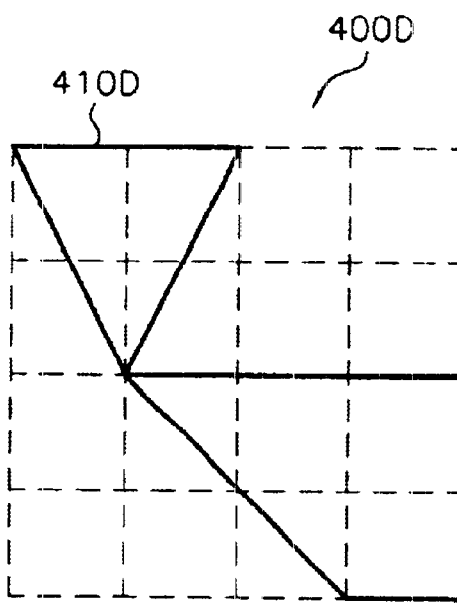
FIG. 4D shows the output polygon of FIG. 4C after rounding.

Referring again to FIG. 4A, the vertex (1.3, 2.3) of the loop (410) of the third output polygon (400) is located in the integer box centered at (1, 2). The edge on the loop (410) of the third output polygon (400) defined by endpoints (0.0, 4.0) (3.0, 0.0) passes through the same integer box. Consequently, as shown in FIG. 4C, the vertex (1.3, 2.3) of the loop (410C) of the third output polygon (400C) is embedded on the edge (0.0, 4.0) (3.0, 0.0) of the loop (410C) by proximity-based rounding, resulting in edge (0.0, 4.0) (3.0, 0.0) being replaced by two new edges (0.0, 4.0) (1.3, 2.3) and (1.3, 2.3) (3.0, 0.0). Then, the vertex (1.3, 2.3) and the new end points at (1.3, 2.3) embedded on edge (0.0, 4.0) (3.0, 0.0) are rounded to integer coordinate (1, 2), as shown in FIG. 4D. The edges associated with the vertex originally located at (1.3, 2.3) are prevented from spuriously intersecting the edge originally defined by coordinates (0.0, 4.0) (3.0,0.0) converted to edge (0, 4) (1, 2) (3, 0). The resulting loop (410D) of the third output polygon (400D) does not self intersect.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for preventing spurious intersections in a polygon due to rounding by using proximity-based rounding, comprising:

identifying a vertex of a polygon which is located within a unit integer box through which an edge of the polygon passes, wherein said vertex is not located on said edge;

embedding the identified vertex on the edge which passes through the same unit integer box; and rounding the embedded vertex to integer coordinates.

2. The process of claim 1 wherein the polygon is an output polygon from a design rule checking algorithm.

3. The process of claim 2 wherein the output polygon is the result of a Boolean operation on two input polygons.

4. The process of claim 2 wherein the output polygon comprises an inner loop and an outer loop wherein a vertex of the inner loop is located within the same unit integer box that an edge of the outer loop passes through.

5. The process of claim 2 wherein the output polygon comprises an outer loop wherein a vertex of the outer loop is located within the same unit integer box that an edge of the outer loop which that vertex is not on passes through.

6. The process of claim 5 wherein the outer loop of the output polygon is a triangle.

7. The process of claim 2 wherein a spurious intersection can cause a topological inconsistency.

8. The process of claim 2 wherein a spurious intersection can cause a negative loop.

9. The process of claim 2 wherein a spurious intersection can cause the output polygon to self-intersect.

10. A process for performing a design rule checking algorithm using proximity-based rounding, comprising the steps of:

inputting two polygons with integer coordinates;

performing a Boolean operation on the polygons, providing an output polygon defined by a list of edges with double coordinates;

identifying a vertex of the output polygon which is located within a unit integer box through which one edge of the output polygon passes, wherein said vertex is not located on said one edge;

embedding the identified vertex on the edge which passes through the same unit integer box;

rounding the embedded vertex to integer coordinates; and outputting an output polygon with integer coordinates.

11. The process of claim 10 wherein the Boolean operation comprises an intersection of the input polygons.

12. The process of claim 10 wherein the Boolean operation comprises a union of the input polygons.

13. The process of claim 10 wherein the Boolean operation comprises a difference of the input polygons.

14. A machine-readable medium, having encoded thereon program code, wherein, when the program code is executed by a machine, the machine implements a process for performing a design rule checking algorithm using proximity-based rounding, comprising the steps of:

inputting two polygons with integer coordinates;

performing a Boolean operation on the polygons, providing an output polygon defined by a list of edges with double coordinates;

identifying a vertex of the output polygon which is located within a unit integer box through which one edge of the output polygon passes, wherein said vertex is not located on said one edge;

embedding the identified vertex on the edge which passes through the same unit integer box;

rounding the embedded vertex to integer coordinates; and outputting an output polygon with integer coordinates.

15. A program storage device readable by a machine, tangibly embodying a program of instructions executable by the machine to perform the method steps for preventing spurious intersections of a polygon during rounding, said method steps comprising:

identifying a vertex of a polygon which is located within a unit integer box through which an edge of the polygon passes, wherein said vertex is not located on said edge;

embedding the identified vertex on the edge which passes through the same unit integer box; and rounding the embedded vertex to integer coordinates.

* * * * *